United States Patent
Balcome et al.

(10) Patent No.: US 8,528,203 B2
(45) Date of Patent: Sep. 10, 2013

(54) PROVIDING SELECTIVE VIA PLATING USING LASER RESIN ACTIVATION

(75) Inventors: Gregory E. Balcome, Rochester, MN (US); Brett P. Krull, Urbana, IL (US); Joseph Kuczynski, Rochester, MN (US); Terry G. Ryks, Brownsdale, MN (US); Timothy J. Tofil, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 150 days.

(21) Appl. No.: 13/154,821

(22) Filed: Jun. 7, 2011

(65) Prior Publication Data

US 2012/0312589 A1    Dec. 13, 2012

(51) Int. Cl.
*H01K 3/10* (2006.01)

(52) U.S. Cl.
USPC ............. 29/852; 29/830; 29/846; 174/258; 174/262; 216/65

(58) Field of Classification Search
USPC ............ 29/830, 846, 848, 851, 852; 216/18, 216/65; 219/121.17; 174/258, 261, 262; 361/750; 427/97.2
See application file for complete search history.

(56) References Cited

U.S. PATENT DOCUMENTS

| | | | |
|---|---|---|---|
| 4,159,414 A * | 6/1979 | Suh et al. | 29/851 |
| 4,975,142 A * | 12/1990 | Iannacone et al. | 29/852 |
| 5,955,179 A | 9/1999 | Kickelhain et al. | |
| 7,060,421 B2 | 6/2006 | Naundorf et al. | |
| 7,547,849 B2 * | 6/2009 | Lee et al. | 174/258 |
| 2010/0044095 A1 | 2/2010 | Kuczynski et al. | |
| 2010/0044096 A1 | 2/2010 | Kuczynski et al. | |

OTHER PUBLICATIONS

Gisin et al., "Overview of Backdrilling", Sanmina-SCI Corp., San Jose, California, pdf file dated Feb. 1, 2007, http://www.sanmina.com/Solutions/pdfs/pcbres/Backdrilling.pdf.

"3-Dimensional Circuitry, Laser Direct Structuring Technology (LPKF-LDS(TM)) for Moulded Interconnect Devices", LPKF Laser & Electronics AG, Garbsen, Germany, pdf file dated Oct. 21, 2008, http://www.lpkf.com/_mediafiles/1797-lpkf-lds-process.pdf.

* cited by examiner

*Primary Examiner* — Donghai D Nguyen
(74) *Attorney, Agent, or Firm* — Matthew J. Bussan

(57) ABSTRACT

An enhanced mechanism for via stub elimination in printed wiring boards (PWBs) and other substrates employs laser resin activation to provide selective via plating. In one embodiment, the resin used in insulator layers of the PWB contains spinel-based non-conductive metal oxide. Preferably, only insulator layers through which vias will pass contain the metal oxide. Those layers are registered and laser irradiated at via formation locations to break down the metal oxide and release metal nuclei. Once these layers are irradiated, all layers of the PWB or subcomposite are laid up and laminated. The resulting composite or subcomposite is subsequently drilled through and subjected to conventional PWB fabrication processes prior to electroless copper plating and subsequent copper electroplating. Because metal nuclei were released only in the via formation locations of the appropriate layers, plating occurs in the via barrels only along those layers and partially plated vias are created without stubs.

8 Claims, 9 Drawing Sheets

PROVIDING SELECTIVE VIA PLATING USING LASER RESIN ACTIVATION

BACKGROUND OF THE INVENTION

1. Field of Invention

The present invention relates in general to the electrical connector field. More particularly, the present invention relates to a method of eliminating a via stub in printed wiring boards (PWBs) and other substrates, such as laminate subcomposites and interconnect substrates. The present invention also relates to PWBs and other substrates fabricated using the method, and a design process therefor.

2. Background Art

Electrical connectors are in widespread use in the electronics industry. In many computer and other electronic circuit structures, an electronic module such as a central processor unit (CPU), memory module, application-specific integrated circuit (ASIC) or other integrated circuit, must be connected to a printed wiring board (PWB). Printed wiring boards are also known as printed circuit boards (PCBs). When populated with one or more electronic components, a printed wiring board is often referred to as a printed wiring board assembly (PWBA) or a printed circuit board assembly (PCBA). In connecting an electronic module to a PWB, individual electrical contacts on the base of the electronic module must be connected to a plurality of corresponding individual electrical contacts on the PWB. This set of contacts on the PWB dedicated to contacting the electronic module contacts is known as a land grid array (LGA) site when a LGA connector is used to connect the electronic module to the PWB.

Typically, the PWB contains a plurality of vias, each electrically connecting a conductive trace on one layer of the PWB to one or more conductive traces on one or more other layers of the PWB. The vias may be at the LGA site, for example, or elsewhere on the PWB. FIG. 1 illustrates exemplary types of conventional vias in a cross-section of a PWB 100 having a plurality of insulator layers 102 and conductive traces 104. Typically, vias are electroplated (e.g., copper or other highly conductive metal) onto through-holes drilled into the PWB. Such a via, which extends from one surface of the PWB to the other surface of the PWB, is referred to as a plated-through-hole (PTH) via. An exemplary PTH via 110 is illustrated in FIG. 1. In addition to or in lieu of PTH vias, it is also not uncommon for high layer-count PWBs to have blind vias, which are visible only on one surface of the PWB, and/or buried vias, which are visible on neither surface of the PWB. An exemplary blind via 120 is illustrated in FIG. 1, as well as an exemplary buried via 130. Blind vias and buried vias are advantageous over PTH vias in certain respects (e.g., blind vias and buried vias are more efficient from a space utilization perspective than PTH vias, and unlike PTH vias, neither blind vias nor buried vias possess via stubs, which as discussed in more detail below, can significantly distort high speed digital signals that pass through PTH vias). However, blind vias and buried vias are significantly more expensive to fabricate than PTH vias because blind vias and buried vias are produced utilizing subcomposite fabrication steps.

As mentioned above, PTH vias possess via stubs that can significantly distort high speed digital signals that pass through PTH vias. This distortion is often severe and generally increases as the data rate increases. FIG. 2 illustrates a cross-section of a PWB 200 with an exemplary conventional PTH via 210 having a via stub 212 and an exemplary conventional backdrilled PTH via 220. The PWB 200 shown in FIG. 2 has a plurality of insulator layers 202, upper conductive traces 204, and intermediate conductive traces 206. The via stub 212 shown in FIG. 2 is the portion of the PTH via 210 that is not connected in the circuit between an upper conductive trace 204 (or contact-pad-portion of the PTH via 210) and an intermediate conductive trace 206.

A conventional technique known as backdrilling can be used to remove the via stub 212, which serves no useful function in this circuit. Backdrilling uses controlled depth drilling techniques to remove the undesired conductive plating in the via stub region. Typically, the via stub region is removed using a drill bit slightly larger in diameter than the drill bit that was used to create the original via hole. See, for example, the discussion of backdrilling via stubs in the publication of Franz Gisin & Alex Stepinski, "Overview of Backdrilling", Sanmina-SCI Corp., San Jose, Calif., http://www.sanmina.com/Solutions/pdfs/pcbres/Backdrilling.pdf. An exemplary conventional backdrilled PTH via 220 having a backdrilled region 222 is illustrated in FIG. 2. As described in the Gisin & Stepinski publication, decreasing via stub length by backdrilling significantly reduces a particularly problematic form of signal distortion known as deterministic jitter. Because bit error rate (BER) is strongly dependent on deterministic jitter, any reduction in deterministic jitter by backdrilling will significantly reduce the overall BER of an interconnect—often by orders of magnitude. The Gisin & Stepinski publication also lists other key advantages to backdrilling PTH vias including: less signal attenuation due to improved impedance matching; increased channel bandwidth; reduced EMI/EMC radiation from the end of the via stub; reduced excitation of resonance modes, and reduced via-to-via crosstalk. Unfortunately, backdrilling is a costly, time-consuming process.

It should therefore be apparent that a need exists for an enhanced mechanism for via stub elimination in PWBs and other substrates, such as interconnect substrates.

SUMMARY OF THE INVENTION

According to the preferred embodiments of the present invention, laser resin activation is employed to provide selective via plating in printed wiring boards (PWBs) and other substrates. The selective via plating achieved by laser resin activation completely eliminates via stubs and the problems associated with via stubs. In one embodiment, the resin used in insulator layers of the PWB is formulated to contain spinel-based electrically non-conductive metal oxide. Preferably, only insulator layers through which vias will pass contain the metal oxide. Those layers are registered and laser irradiated at via formation locations to break down the metal oxide and release metal nuclei. Once these layers are irradiated, all layers of the PWB or subcomposite are laid up and laminated. The resulting composite or subcomposite is subsequently drilled through and subjected to conventional PWB fabrication processes prior to electroless copper plating and subsequent copper electroplating. Because metal nuclei were released only in the via formation locations of the appropriate layers, plating occurs in the via barrels only along those layers and partially plated vias are created without stubs. This advantageously eliminates the costly and time consuming process of via stub backdrilling.

The foregoing and other features and advantages of the present invention will be apparent from the following more particular description of the preferred embodiments of the present invention, as illustrated in the accompanying drawings.

BRIEF DESCRIPTION OF THE DRAWINGS

The preferred exemplary embodiments of the present invention will hereinafter be described in conjunction with the appended drawings, where like designations denote like elements.

FIG. 4A is a partial, sectional view of a first exemplary insulator layer containing spinel-based electrically non-conductive metal oxide that is laser activated at one or more via formation locations in accordance with the preferred embodiments of the present invention.

FIG. 4B is a partial, sectional view of a second exemplary insulator layer containing spinel-based electrically non-conductive metal oxide that is laser activated at one or more via formation locations in accordance with the preferred embodiments of the present invention.

FIG. 4C is a partial, sectional view of exemplary insulator layers, including the first and the second exemplary insulator layers shown in FIGS. 4A and 4B, respectively, arranged in a stack-up prior to lamination in accordance with the preferred embodiments of the present invention.

FIG. 4D is a partial, sectional view of the stack-up shown in FIG. 4C after lamination of the exemplary insulator layers to form a composite substrate in accordance with the preferred embodiments of the present invention.

FIG. 4E is a partial, sectional view of the composite substrate shown in FIG. 4D after drilling through-holes at the via formation locations in accordance with the preferred embodiments of the present invention.

FIG. 4F is a partial, sectional view of the composite substrate shown in FIG. 4E after electroless copper plating on the laser activated portion of the through-holes to form electroless copper in the through-holes in accordance with the preferred embodiments of the present invention.

FIG. 4G is a partial, sectional view of the composite substrate shown in FIG. 4F after copper electroplating on the electroless copper in the through-holes to form stub-less vias in accordance with the preferred embodiments of the present invention.

DETAILED DESCRIPTION OF THE PREFERRED EMBODIMENTS

Figure 1:
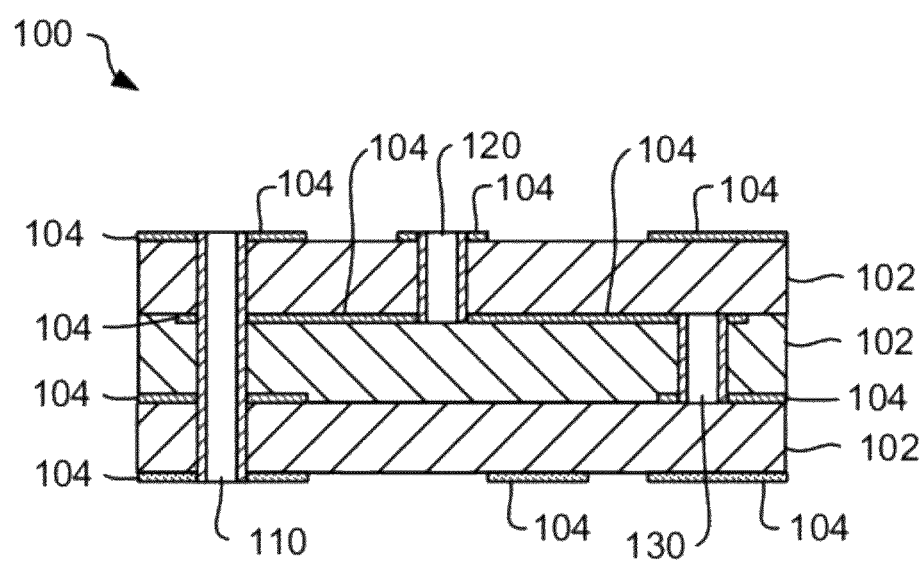
FIG. 1 is a partial, sectional view of a printed wiring board (PWB) having exemplary types of conventional vias, including a plated-through-hole (PTH) via, a blind via and a buried via.

In accordance with the preferred embodiments of the present invention, laser resin activation is employed on a layer-by-layer basis to provide selective via plating and, thereby, achieve via stub elimination in printed wiring boards (PWBs) and other substrates, such as laminate subcomposites and interconnect substrates. To facilitate laser resin activation, at least one spinel-based electrically non-conductive metal oxide (e.g., the copper-containing spinel PK 3095 made by Ferro GmbH) is added to a conventional resin used to fabricate one or more insulator layers of the PWB. Preferably, only insulator layers through which vias will pass contain the metal oxide. Those layers are registered and laser irradiated at one or more via formation locations to break down the metal oxide and release metal nuclei. Laser irradiation is performed on a layer-by-layer basis to create areas of laminate that are electrically conductive and that can be dimensionally precisely controlled. This enables the fabrication of a precisely, selectively metallized via that eliminates any via stub. Once these layers are irradiated, all layers of the PWB or subcomposite are laid up and laminated. The resulting composite or subcomposite is subsequently drilled through and subjected to conventional PWB fabrication processes prior to electroless copper plating and subsequent copper electroplating. Metal nuclei released in the via formation locations and exposed on the wall of the through-holes serve as a catalyst for electroless copper plating. Because metal nuclei were released only in the via formation locations of the appropriate layers, plating occurs in the via barrels only along those layers and, thus, partially plated vias are created without stubs. This advantageously eliminates the costly and time consuming process of via stub backdrilling.

In addition to eliminating via stub backdrilling, incorporation of a spinel-based electrically non-conductive metal oxide additive into a PWB resin also eliminates several materials/processes associated with the use of conventional deposition techniques and/or via stub backdrilling, such as:
 eliminates the need for a seed layer in the through-hole (i.e., such a seed layer is employed in conventional electrolytic deposition processes and conventional electroless plating processes); and
 eliminates the need to remove drilling debris produced by via stub backdrilling.

Moreover, the elimination of via stub backdrilling also eliminates several risks associated with via stub backdrilling, such as:
 Conductive drilling debris (e.g., conductive copper debris may vibrate loose and short adjacent traces);
 IP (inner plane) separation (e.g., separation may occur if the drill bit is excessively worn/damaged or drilling pressure is too high); and
 Incomplete stub removal (e.g., extended via stubs result from misalignment of the drill bit. These extended via stubs serve as antennas that enhance deterministic jitter and degrade signal performance).

In addition, the elimination of via stub backdrilling and the risks associated therewith enables tighter via clearance.

Figure 3:
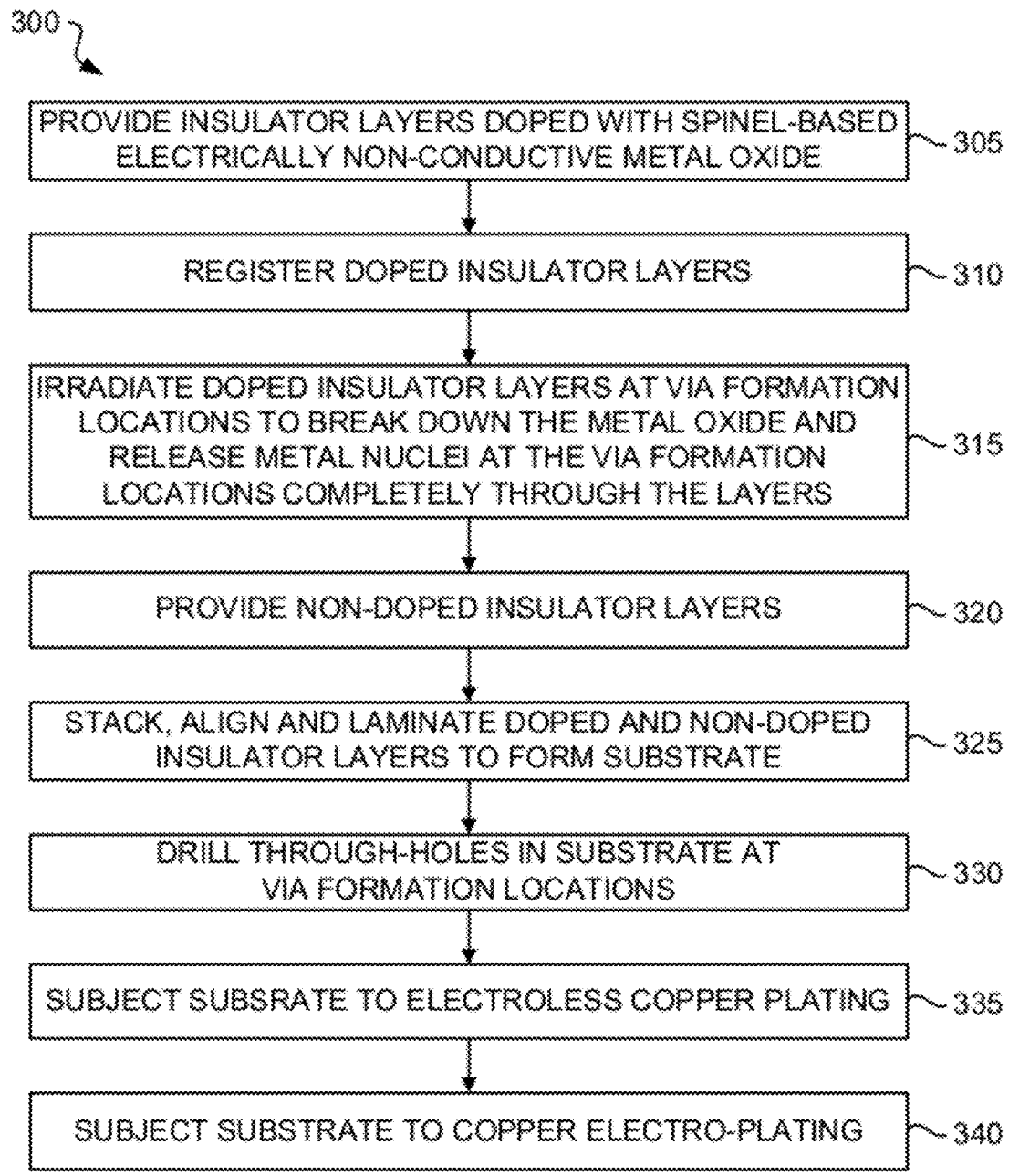
FIG. 3 is a flow diagram illustrating an exemplary method of fabricating one or more stub-less vias in a printed wiring board (PWB) or other substrate in accordance with the preferred embodiments of the present invention.

FIG. 3 is a flow diagram illustrating an exemplary method 300 for fabricating one or more stub-less vias in a PWB or other substrate in accordance with the preferred embodiments of the present invention. In the method 300, the steps discussed below (steps 305-340) are performed. These steps are set forth in their preferred order. It must be understood, however, that the various steps may occur simultaneously or at other times relative to one another. Moreover, those skilled in the art will appreciate that one or more steps may be omitted.

FIGS. 4A-4G depict in partial sectional views, successive stages in the exemplary method 300 (illustrated in FIG. 3) of fabricating one or more stub-less vias in a PWB in accordance with the preferred embodiments of the present invention. FIGS. 4A-4G set forth the preferred order of the stages consistent with the exemplary fabrication method 300 (illustrated in FIG. 3).

One skilled in the art will appreciate that the PWB fabricated in the successive stages illustrated in FIGS. 4A-4G (including the number and configuration of through-holes, internal conductive traces, and insulator layers) is exemplary and set forth for purposes of explanation—not limitation. In general, a PWB may contain any number and/or configuration of through-holes, internal conductive traces, and insulator layers. The present invention may be utilized in the context of any PWB or other substrate, such as a laminate subcomposite, an interconnect substrate (e.g., an interposer or a module substrate) or a flex cable.

Referring now back to FIG. 3, the method 300 begins by providing one or more insulator layers doped with a spinel-based electrically non-conductive metal oxide (step 305). Preferably, only insulator layers through which vias will pass are doped with the metal oxide. In each "doped" insulator layer, one or more spinel-based electrically non-conductive metal oxides is/are very finely distributed in an electrically non-conductive matrix material.

Except for the presence of one or more spinel-based electrically non-conductive metal oxides, the composition of each doped insulator layer is conventional. The doped insulator layer(s) may be, for example, a prepreg and/or core.

Preferably, the electrically non-conductive matrix material in each doped insulator layer is a conventional resin used in PWB fabrication. The electrically non-conductive matrix material may be, for example, FR-4 (i.e., composite laminate of a resin epoxy reinforced with a woven fiberglass mat) or other suitable organic or inorganic dielectric materials. Typically, such dielectric materials include epoxy resins, ceramics, polyphenylene oxide (PPO)/triallylisocyanurate (TAIC) blends, and perfluorinated or chlorinated materials.

Preferably, the spinel-based electrically non-conductive metal oxide in each doped insulator layer is a conventional spinel-based electrically non-conductive metal oxide that is typically used in conventional laser direct structuring (LDS) processing. Conventional spinel-based electrically non-conductive metal oxides are typically used in conventional LDS processing to deposit a metallized layer onto the surface of molded, plastic parts. U.S. Pat. No. 7,060,421 B2, issued Jun. 13, 2006 to Naundorf et al., entitled "CONDUCTOR TRACK STRUCTURES AND METHOD FOR PRODUCTION THEREOF", which discloses conventional spinel-based electrically conductive metal oxides, is hereby incorporated herein by reference in its entirety.

In conventional LDS processing of plated-through-hole (PTH) vias in the prior art, to ensure that the laser can process the inside walls of the PTH vias at a suitable angle of incidence, the vias must be conical on one or both sides of the through-hole depending on the thickness of the material through which the PTH vias extend. In the case of the PTH vias extending through thick walls, the prior art suggests that the internal diameters of the vias must be enlarged to ensure unimpeded processing by the laser beam (aspect ratio of simple cones 1:1; for double cones 2:1). These are serious limitations in the context of PWBs, where space is at a premium. The present invention overcomes these serious limitations of the prior art by laser irradiating the appropriate insulator layers on a layer-by-layer basis completely through (rather than on the surface of conical through-holes), followed by subsequent lamination of the layers and then drilling of one or more through-holes.

The spinel-based electrically non-conductive metal oxide in each doped insulator layer may be, for example, spinel-based higher oxides which contain at least two different kinds of cations and have a spinel structure or spinel-related structure, and which break up to create metal nuclei in irradiated areas of the insulator layer but remain unchanged in non-irradiated areas of the insulator layer (i.e., one or more via formation locations of the insulator layer are subsequently laser irradiated in step 315, described below, while other areas of the insulator layer are non-irradiated). A suitable spinel-based electrically non-conductive metal oxide also must be high-temperature stable (i.e., the spinel-based electrically non-conductive metal oxide does not change to become electrically conductive upon exposure soldering temperatures). Classic spinels are mixed metal oxides of magnesium and aluminum, but the magnesium may be wholly or partially replaced by iron, zinc and/or manganese, and the aluminum may be wholly or partially replaced by iron and/or chromium. Spinel-related mixed oxide structures also may contain nickel and/or cobalt. It may be advantageous if the spinel or spinel-related structure contains copper, chromium, iron, cobalt, nickel or a mixture of two or more of the foregoing. Copper may be particularly advantageous (e.g., the copper-containing spinel PK 3095 made by Ferro GmbH). Those skilled in the art will appreciate, however, that any suitable spinel-based electrically non-conductive metal oxide may be utilized.

An insulator layer that is suitably-doped with one or more spinel-based electrically non-conductive metal oxides, upon activation by laser irradiation at one or more via formation locations (which, as described below, occurs in step 315), facilitates creation of metallic nuclei sites that are conductive and suitable for subsequent electroplating. The metallic nuclei released at these sites catalyze electroless copper plating. Typically, a suitable concentration of the spinel-based electrically non-conductive metal oxide in the insulator layer is approximately 5%. One skilled in the art will appreciate, however, suitable concentrations of the spinel-based electrically non-conductive metal oxide will vary depending on a number of factors including, but limited to, the particular spinel-based electrically non-conductive metal oxide utilized, the particular electrically non-conductive matrix material utilized (which, as described below, may contain filler(s) and/or flame retardant(s), and may be reinforced with at least one woven fiberglass mat), the thickness of the insulator layer, and the intensity of the laser used to irradiate the insulator layer.

The electrically non-conductive matrix material may contain one or more inorganic fillers, e.g., silica particles, silicic acid and/or silicic acid derivatives, along with one or more flame retardants, e.g., one or more brominated organic compounds. The presence of one or more inorganic fillers and/or one or more flame retardants in the insulator layers is conventional.

For example, 25 parts by weight of a pyrogenic silicic acid with a BET (Brunauer, Emmett and Teller) surface area of 90 $m^2/g$ may be added to 70 parts by weight of a conventional resin (e.g., the resin epoxy used in FR-4), along with 5% of the copper-containing spinel PK 3095 made by Ferro GmbH. These materials may be compounded in an extruder. The copper-containing spinel PK 3095 must be very finely distributed in the extruded material. Using any one of a number of conventional processes, this extruded material may then be processed to form a doped insulator layer. For example, utilizing a conventional process typically used to form FR-4 glass reinforced epoxy laminate sheets, the extruded material may be laminated with one or more woven fiberglass mats to form a doped insulator layer of reinforced composite laminate.

Preferably, the thickness of each doped insulator layer ranges from approximately 2 mils to approximately 10 mils (1 inch=1000 mils). Generally, the thickness(es) of the doped insulator layer(s) is/are conventional. Also, the thickness(es) of the doped insulator layer(s) generally correspond to the thickness(es) of the non-doped insulator layer(s) (which, as described below, is/are provided in step 320).

The method 300 continues by registering the one or more doped insulator layers with respect to a positional control mechanism or system (step 310). For example, each of the insulator layers (doped and non-doped) may include one or more mechanical and/or optical features (not shown) that is/are used to position (register) the insulator layer relative to one or more datum points. This registration facilitates the correct positioning of one or more lasers over the one or more via formation locations of the doped insulator layers (in step 315, described below). Subsequent registration of the same mechanical and/or optical feature(s) may also facilitate layer-to-layer alignment of the insulator layers (doped and non-doped) within the stack up during lamination of the insulator layers to form a composite substrate (in step 325, described below), and facilitate the correct positioning of one or more drill bits over the one or more via formation locations of the doped insulator layers during a through-hole drilling operation (in step 330, described below).

The method 300 continues by irradiating the one or more doped insulator layers with laser radiation at one or more via formation locations to break down the spinel-based electrically non-conductive metal oxide and release metal nuclei at the one or more via formation locations completely through the insulator layer (step 315). An example of a suitable laser is a diode-pumped Nd:YAG laser. The intensity of the laser radiation must be sufficient to form metal nuclei completely through the doped insulator layer, i.e., from the upper surface of the doped insulator layer to the lower surface of the doped insulator layer. Hence, it may be necessary to empirically determine a suitable intensity of the laser radiation by trial and error. It is advantageous to use a laser to produce the electromagnetic radiation to release the metal nuclei. The wavelength of the laser is advantageously 248 nm, 308 nm, 355 nm, 532 nm, 1064 nm or even 10,600 nm.

In order to minimize any registration tolerance concerns, the irradiated area can be controlled to any desired diameter (with one caveat, the diameter of each irradiated area must be greater than the diameter of the through-hole that is to be drilled in step 330 (described below) through the irradiated area—i.e., metal nuclei released in the irradiated area must be present on the wall of the through-hole after the through-hole has been drilled through the irradiated area). For example, a registration tolerance concern may arise in step 325 (described below) with respect to the layer-to-layer alignment of the irradiated areas where metal nuclei are released. Another registration tolerance concern may arise in step 330 (described below) with respect to the relative position of each through-hole (as actually drilled) and the irradiated area where metal nuclei are released.

Figure 4A:
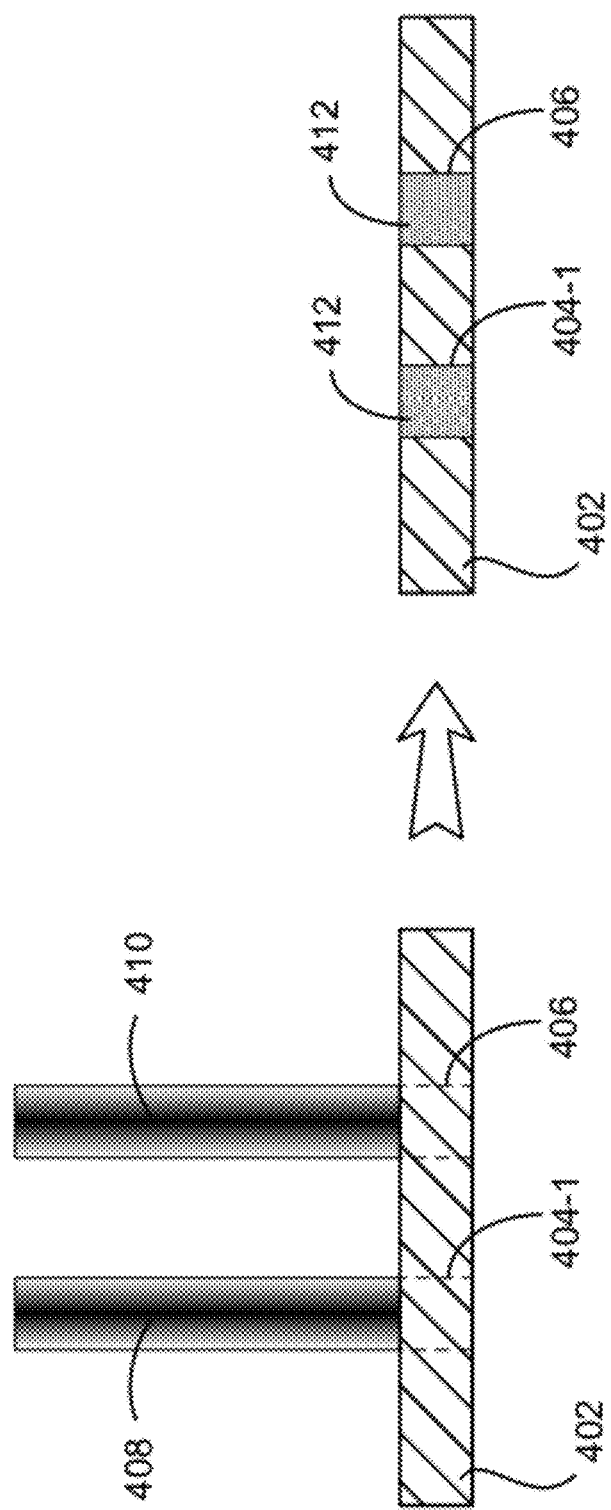
FIGS. 4A-4G illustrate successive stages in the exemplary method illustrated in FIG. 3.

FIG. 4A is a partial, sectional view of a first exemplary insulator layer 402 containing spinel-based electrically non-conductive metal oxide (i.e., "doped" insulator layer 402) that is laser activated at via formation locations 404-1 and 406 in accordance with the preferred embodiments of the present invention. As illustrated in FIG. 4A, a laser beam 408 is focused on the via formation location 404-1 of the doped insulator layer 402 at an appropriate angle of incidence (i.e., preferably 90°), and a laser beam 410 is focused on the via formation location 406 of the doped insulator layer 402 at an appropriate angle of incidence (i.e., preferably 90°). The laser beams 408 and 410 may be output from two different lasers, or may be output from a single laser (e.g., a single laser may be sequentially positioned over the via formation locations 404-1 and 406). This laser irradiation breaks down the spinel-based electrically non-conductive metal oxide and releases metal nuclei (denoted as small dots 412 in FIG. 4A) at the via formation locations 404-1 and 406 completely through the doped insulator layer 402.

Figure 4B:
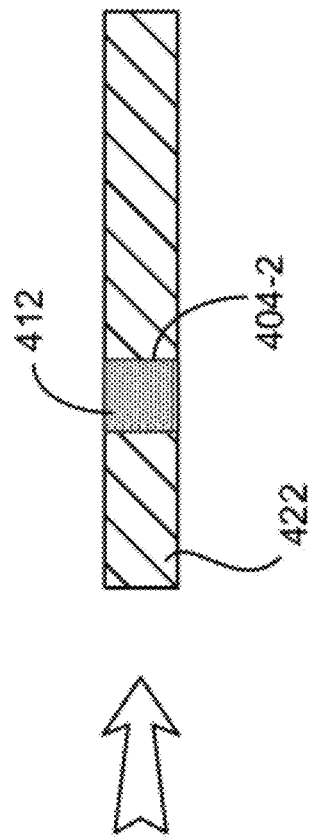

FIG. 4B is a partial, sectional view of a second exemplary insulator layer 422 containing spinel-based electrically non-conductive metal oxide (i.e., "doped" insulator layer 422) that is laser activated at via formation location 404-2 in accordance with the preferred embodiments of the present invention. As illustrated in FIG. 4B, a laser beam 426 is focused on the via formation location 404-2 of the doped insulator layer 422 at an appropriate angle of incidence (i.e., preferably 90°). This laser irradiation breaks down the spinel-based electrically non-conductive metal oxide and releases metal nuclei (denoted as small dots 412 in FIG. 4B) at the via formation location completely through the doped insulator layer 422

Referring now back to FIG. 3, the method 300 continues by providing one or more "non-doped" insulator layers (step 320). Preferably, only insulator layers through which vias will pass contain the metal oxide. Each of the one or more non-doped insulator layers comprises an electrically non-conductive matrix material without a spinel-based electrically non-conductive metal oxide distributed therein. One skilled in the art will appreciate, however, that a doped insulator layer may be used in lieu of a non-doped insulator layer.

The composition of each non-doped insulator layer is conventional. The non-doped insulator layer(s) may be, for example, a prepreg and/or core.

Preferably, the electrically non-conductive matrix material in each non-doped insulator layer is a conventional resin used in PWB fabrication. The electrically non-conductive matrix material may be, for example, FR-4 (i.e., composite laminate of a resin epoxy reinforced with a woven fiberglass mat) or other suitable organic or inorganic dielectric materials. Typically, such dielectric materials include epoxy resins, ceramics, polyphenylene oxide (PPO)/triallylisocyanurate (TAIC) blends, and perfluorinated or chlorinated materials.

The electrically non-conductive matrix material in each non-doped insulator layer may contain one or more inorganic fillers, e.g., silica particles, silicic acid and/or silicic acid derivatives, along with one or more flame retardants, e.g., one or more brominated organic compounds. The presence of one or more inorganic fillers and/or one or more flame retardants in the insulator layers is conventional.

The thickness of each non-doped insulator layer ranges from approximately 2 mils to approximately 10 mils (1 inch=1000 mils). Generally, the thickness(es) of the non-doped insulator layer(s) is/are conventional.

The method 300 then continues by stacking, aligning and laminating the one or more doped insulator layers that were irradiated in step 315 and the one or more non-doped insulator layers to form a composite substrate (step 325). As mentioned above, each of the insulator layers (doped and non-doped) may include one or more mechanical and/or optical features (not shown) that is/are used to position (register) the insulator layer relative to one or more datum points. Registration of these mechanical and/or optical features also facilitates layer-to-layer alignment of the insulator layers (doped and non-doped) within the stack up during lamination of the insulator layers to form the composite substrate.

Figure 4C:
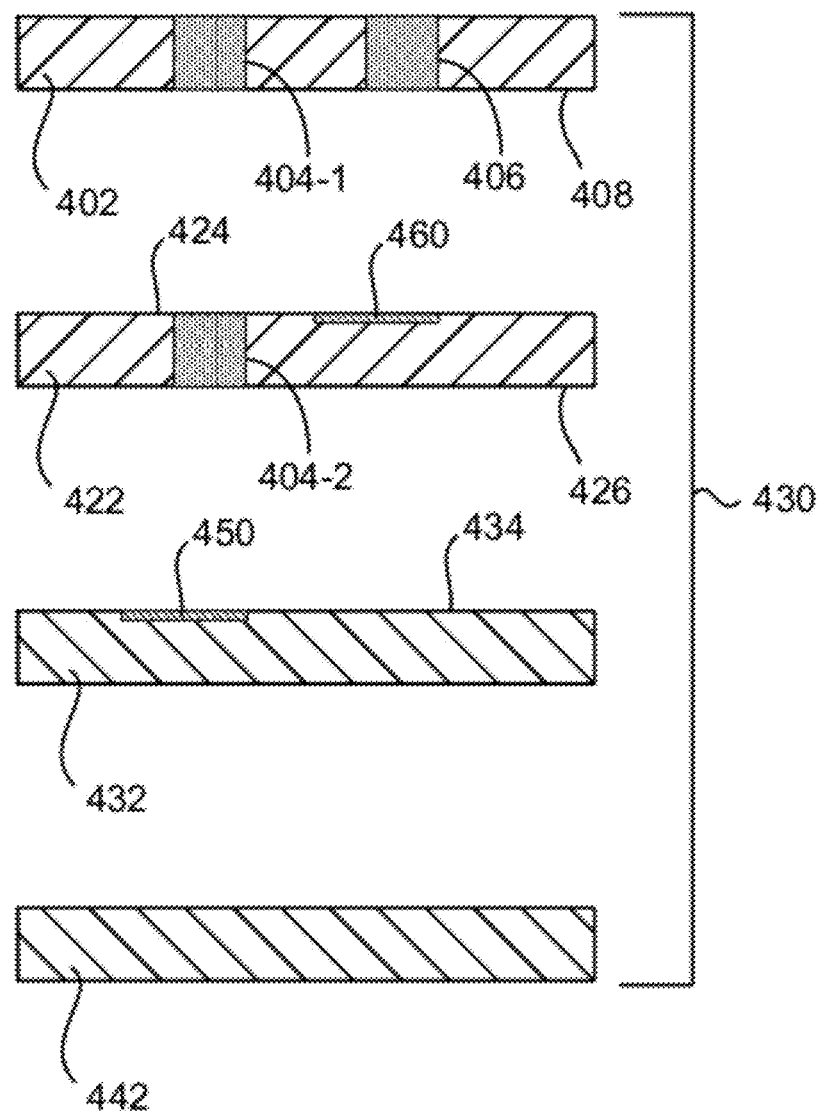

FIG. 4C is a partial, sectional view of exemplary insulator layers, including the doped insulator layers 402 and 422 shown in FIGS. 4A and 4B, respectively, arranged in a stack-up 430 prior to lamination in accordance with the preferred embodiments of the present invention. The stack up 430 illustrated in FIG. 4C includes both doped insulator layers and non-doped insulator layers, i.e., doped insulator layers 402 and 422 and non-doped insulator layers 432 and 442.

As illustrated in FIG. 4C, the via formation location 404-1 of the doped insulator layer 402 vertically aligns in the stack-up 430 with the via formation location 404-2 of the doped insulator layer 422, as well as an electrically conductive trace 450 interposed between the doped insulator layer 422 and the non-doped insulator layer 432. The via formation location 404-1 of the doped insulator layer 402 and the via formation location 404-2 of the doped insulator layer 422 are together referred to herein as "via formation location 404". The electrically conductive trace 450 is configured to make electrical contact with a plated via to be formed at the via formation location 404 (i.e., the stacked combination of the via formation location 404-1 of the doped insulator layer 402 and the via location formation location 404-2 of the doped insulator layer 422).

The electrically conductive trace 450 may be formed on an upper surface 434 of the non-doped insulator layer 432 as illustrated in FIG. 4C. Alternatively, the electrically conductive trace 450 may be formed on a lower surface 426 of the doped insulator layer 422, or otherwise imposed between the doped insulator layer 422 and the non-doped insulator layer 432.

The electrically conductive trace 450 may be formed on the upper surface 434 of the non-doped insulator layer 432 (or the lower surface 426 of the doped insulator layer 422) using conventional deposition techniques (e.g., employing an etching process).

Alternatively, the electrically conductive trace 450 may be formed on the lower surface 426 of the doped insulator layer 422 using conventional LDS processing (e.g., laser resin activation on the lower surface 426 of the doped insulator layer 422 may be used to define the configuration of the electrically conductive trace 450). If LDS processing is used to form the electrically conductive trace 450 on the lower surface 426 of the doped insulator layer 422, the laser resin activation that defines the configuration of the electrically conductive trace 450 must be confined to the lower surface 426 of the doped insulator layer 422 and not extend through the doped insulator layer 422.

As also illustrated in FIG. 4C, the via formation location 406 of the doped insulator layer 402 vertically aligns in the stack up 430 with an electrically conductive trace 460 interposed between the doped insulator layer 402 and the doped insulator layer 422. The electrically conductive trace 460 is configured to make electrical contact with a plated via to be formed at the via formation location 406 of doped insulator layer 402.

The electrically conductive trace 460 may be formed on an upper surface 424 of the doped insulator layer 422 as illustrated in FIG. 4C. Alternatively, the electrically conductive trace 460 may be formed on a lower surface 408 of the doped insulator layer 402, or otherwise imposed between the doped insulator layers 402 and 422.

The electrically conductive trace 460 may be formed on the upper surface 424 of the doped insulator layer 422 (or the lower surface 408 of the doped insulator layer 402) using conventional deposition techniques (e.g., employing an etching process).

Alternatively, the electrically conductive trace 460 may be formed on the upper surface 424 of the doped insulator layer 422 (or the lower surface 408 of the doped insulator layer 402) using conventional LDS processing (e.g., laser resin activation on the upper surface 424 of the doped insulator layer 422 may be used to define the configuration of the electrically conductive trace 460). If LDS processing is used to form the electrically conductive trace 460 on the upper surface 424 of the doped insulator layer 422, the laser resin activation that defines the configuration of the electrically conductive trace 460 must be confined to the upper surface 424 of the doped insulator layer 422 and not extend through the doped insulator layer 422. Likewise, if LDS processing is used to form the electrically conductive trace 460 on the lower surface 408 of the doped insulator layer 402, the laser resin activation that defines the configuration of the electrically conductive trace 460 must be confined to the lower surface 408 of the doped insulator layer 402 and not extend through the doped insulator layer 402.

Figure 4D:
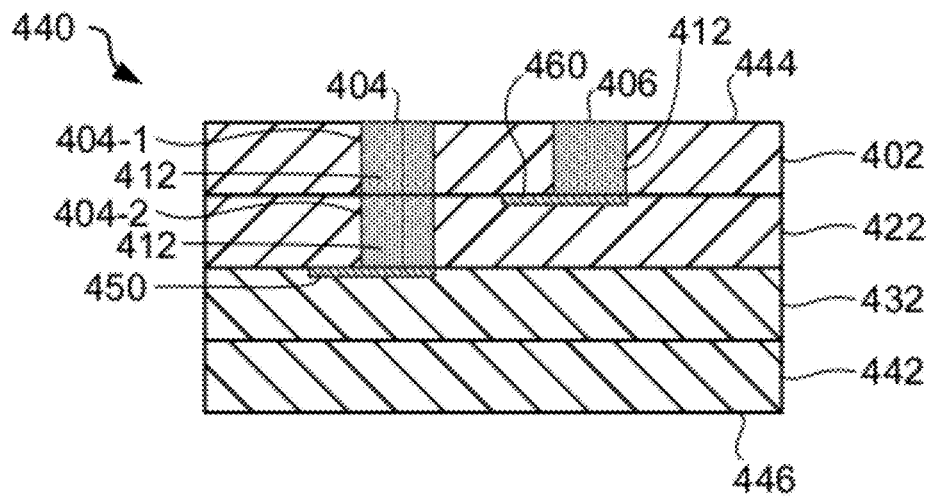

FIG. 4D is a partial, sectional view of the stack up 430 (shown in FIG. 4C) after lamination of the exemplary insulator layers to form a composite substrate 440 in accordance with the preferred embodiments of the present invention. Conventional lamination techniques utilized in PWB fabrication are applied to form the composite substrate 440. The composite substrate 440 is also referred to as "PWB 440".

In the exemplary PWB 440 shown in FIG. 4D, the internal conductive trace 450 is deeper (with respect to an "upper" surface 444 of the PWB 440) than the internal conductive trace 460. That is, the internal conductive trace 450 is nearer a "lower" surface 446 of the PWB 440 than is the internal conductive trace 460.

Referring now back to FIG. 3, the method 300 continues by drilling one or more through-holes in the composite substrate at the one or more via formation locations (step 330). Each of the one or more through-holes extends completely through the composite substrate. Conventional through-hole drilling techniques utilized in PWB fabrication are applied during this step.

Metal nuclei released at the one or more via formation locations in the one or more doped insulator layers during the earlier irradiating step (i.e., step 315, described above) are exposed in the one or more through-holes. In this regard, it is important to note that the diameter of each via formation location must be greater than the diameter of the drill bit used to drill the through-hole through the via formation location—i.e., metal nuclei released in the via formation location must be present on the wall of the through-hole after the through-hole has been drilled through the via formation location. Metal nuclei released in the via formation locations and exposed on the though-hole walls serve to catalyze subsequent electroless copper plating (i.e., step 335, described below).

As mentioned above, each of the insulator layers (doped and non-doped) may include one or more mechanical and/or optical features (not shown) that is/are used to position (register) the insulator layer relative to one or more datum points. Registration of these mechanical and/or optical features also facilitates the correct positioning of one or more drill bits over the one or more via formation locations during the through-hole drilling operation.

The composite substrate may be subjected to typical PWB fabrication processes (e.g., desmear) prior to electroless copper plating (i.e., step 335, described below) and subsequent copper electroplating (i.e., step 340, described below). Desmear is a conventional PWB fabrication process by which epoxy resin is cleaned from the inside of drilled through-holes, typically by utilizing a permanganate solution.

Figure 4E:
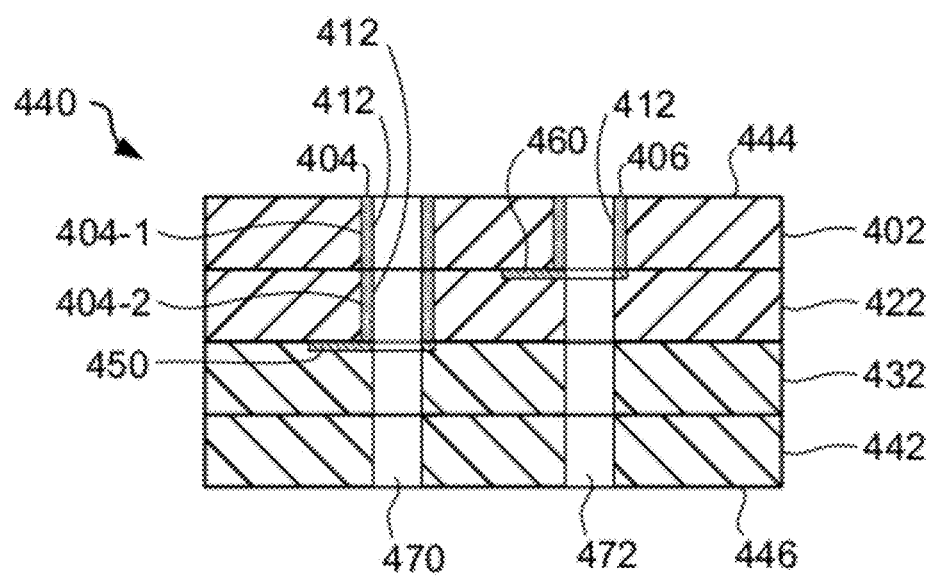

FIG. 4E is a partial, sectional view of the PWB 440 after drilling through-holes 470 and 472 at the via formation locations 404 and 406 in accordance with the preferred embodiments of the present invention. Metal nuclei 412 earlier released through layer-by-layer laser irradiation at the via formation location 404 (i.e., the stacked combination of the via formation location 404-1 of the doped insulator layer 402 and the via location formation location 404-2 of the doped insulator layer 422) and at the via formation location 406 (i.e., the via formation location 406 in the doped insulator layer 402) are exposed in the through-holes 470 and 472.

In the exemplary PWB 440 shown in FIG. 4E, the through-hole 470 passes through the internal conductive trace 450, while the through-hole 472 passes through the internal conducive trace 460.

Referring now back to FIG. 3, the method 300 continues by electroless copper plating on the metal nuclei exposed in each of the one or more through-holes to form electroless copper in each of the one or more through-holes (step 335). Conventional electroless plating techniques utilized in PWB fabrication are applied during this step, with the proviso that the through-holes corresponding to the stub-less vias are masked off during a conventional seeding process used to form conventional vias (i.e., conventional vias may be formed in the PWB along with the stub-less vias). Masking off these through-holes will prevent seeding the entire through-hole. One skilled in the art will appreciate that any desired electroless metal may be utilized in lieu of electroless copper through the use of suitable conventional electroless plating techniques.

Figure 4F:
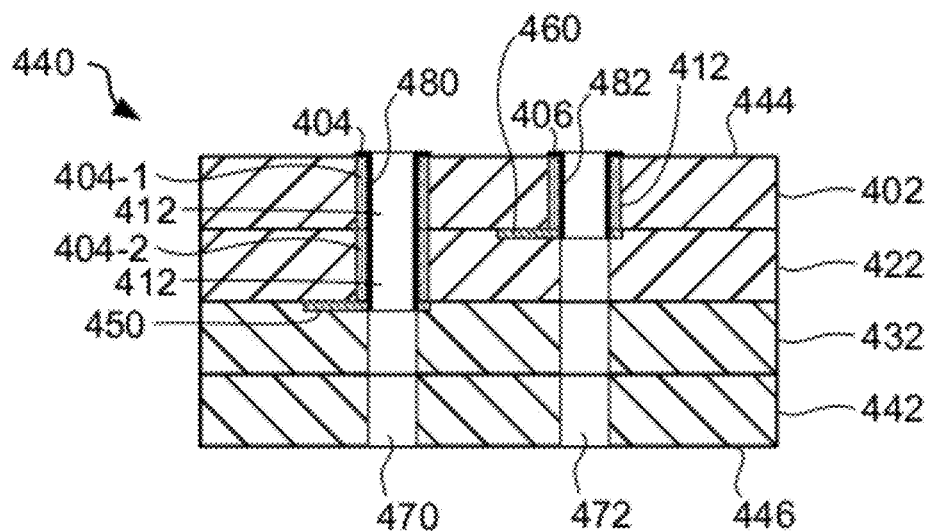

FIG. 4F is a partial, sectional view of the PWB 440 after electroless copper plating on the laser activated portion of the through-holes 470 and 472 to form electroless copper 480 and 482 in the through-holes 470 and 472 in accordance with the preferred embodiments of the present invention. For example, the electroless copper 480 and 482 is formed by contacting the PWB 440 with a conventional electroless copper plating bath. The PWB 440 is then removed from the bath.

The electroless copper 480 is plated both on the metal nuclei 412 exposed in the through-hole 470 and on the electrically conductive trace 450 exposed in the through-hole 470, but not plated on the non-doped insulator layers 432 and 442 exposed in the through-hole 470. Hence, the electroless copper 480 does not extend lower in the through-hole 470 than the electrically conductive trace 450.

The electroless copper 482 is plated both on the metal nuclei 412 exposed in the through-hole 472 and on the electrically conductive trace 460 exposed in the through-hole 472, but neither plated on the non-irradiated portion of the doped insulator layer 422 exposed in the through-hole 472 nor plated on the non-doped insulator layers 432 and 442 exposed in the through-hole 472. Hence, the electroless copper 482 does not extend lower in the through-hole 472 than the electrically conductive trace 460.

In addition, an extension of the electroless copper 480 and 482 is formed on the "upper" surface 444 of the PWB 440 immediately adjacent to the through-holes 470 and 472. The diameter of this extension of the electroless copper 480 and 482 (also referred to herein as a "contact-pad-portion" of the electroless copper 480 and 482) is defined by the diameter of the via formation locations 404 and 406 (i.e., metal nuclei released in these irradiated areas are exposed on the "upper" surface 444 of the PWB 440).

Referring now back to FIG. 3, the method 300 continues by copper electroplating on the electroless copper in each of the one or more through-holes to form a conductive via in each of the one or more through-holes (step 340). Conventional electroplating techniques utilized in PWB fabrication are applied during this step. One skilled in the art will appreciate that electroplate of any desired metal may be used to form the conductive vias through the use of suitable conventional electroplating techniques.

Figure 4G:
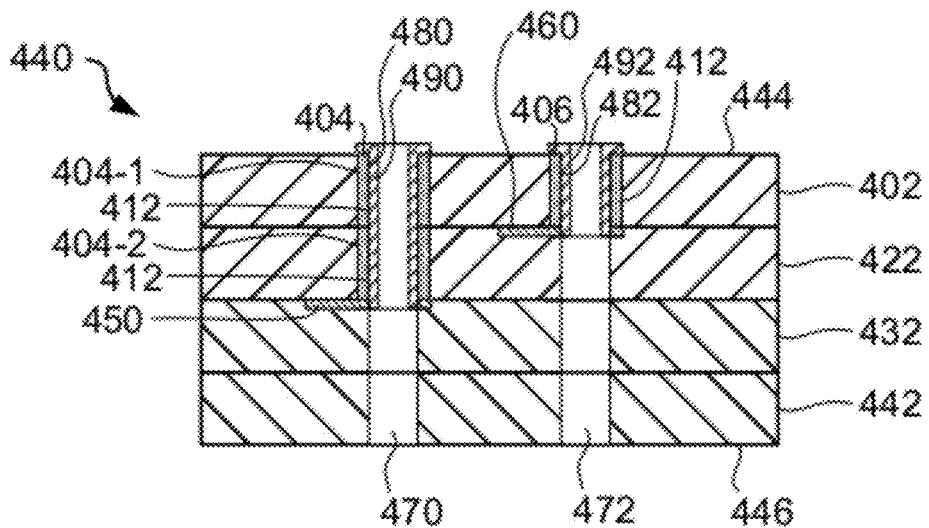

FIG. 4G is a partial, sectional view of the PWB 440 after copper electroplating on the electroless copper 480 and 482 exposed in the through-holes 470 and 472 to form stub-less vias 490 and 492 in accordance with the preferred embodiments of the present invention. The vias 490 and 492 may be electroplated onto the electroless copper 480 and 482 using a conventional electrolytic deposition process.

The stub-less via 490 forms on the electroless copper 480 exposed in the through-hole 470, but not on the non-doped insulator layers 432 and 442 exposed in the through-hole 470. In addition, the stub-less via 490 may extend as a contact pad on the "upper" surface 444 of the PWB 440 immediately adjacent to the through-hole 470 (i.e., this contact pad is formed on the contact-pad-portion of the electroless copper 480 onto the "upper" surface 444 of the PWB 440). This contact pad is also referred to herein as a "contact-pad-portion" of the stub-less via 490. The stub-less via 490 establishes electrical connection between the contact pad and the internal conductive trace 450. Hence, the stub-less via 490 is "stub-less" because it does not extend lower in the through-hole 470 than does the electrically conductive trace 450.

The stub-less via 492 forms on the electroless copper 482 exposed in the through-hole 472, but neither on the non-irradiated portion of the doped insulator layer 422 exposed in the through-hole 472 nor on the non-doped insulator layers 432 and 442 exposed in the through-hole 472. In addition, the stub-less via 492 may extend as a contact pad on the "upper" surface 444 of the PWB 440 immediately adjacent to the through-hole 472 (i.e., this contact pad is formed on the contact-pad-portion of the electroless copper 482 onto the "upper" surface 444 of the PWB 440). This contact pad is also referred to herein as a "contact-pad-portion" of the stub-less via 492. The stub-less via 492 establishes electrical contact between the contact pad and the internal conductive trace 460. Hence, the stub-less via 492 is "stub-less" because it does not extend lower in the through-hole 472 than does the electrically conductive trace 460.

Figure 2:
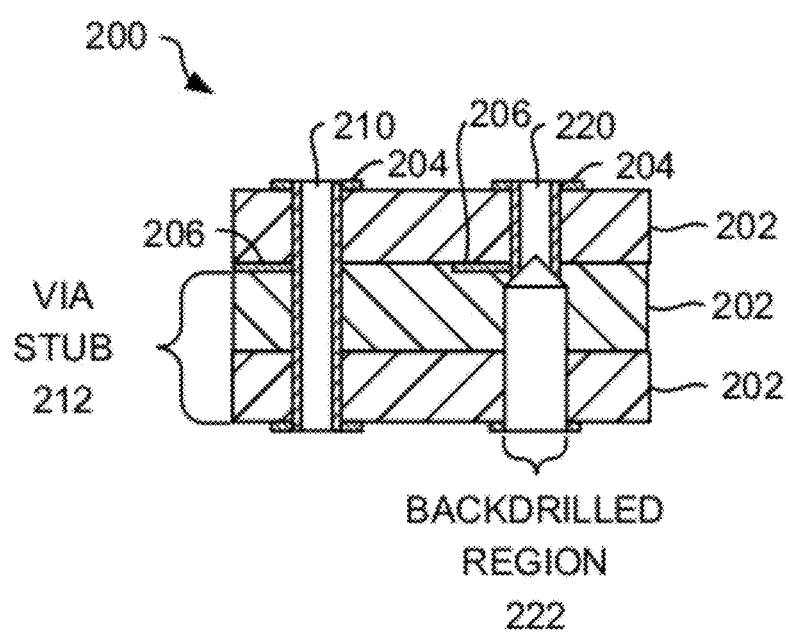
FIG. 2 is a partial, sectional view of a printed wiring board (PWB) with an exemplary conventional plated-through-hole (PTH) via having a stub and an exemplary conventional back-drilled PTH via.

A stub-less via fabricated in accordance with the preferred embodiments of the present invention (e.g., the stub-less vias 490 and 492 shown in FIG. 4G) terminates in a non-tooled edge substantially at an internal conductive trace (e.g., the internal conductive traces 450 and 460 shown in FIG. 4G). A conventional backdrilled via formed by the costly, time-consuming process of backdrilling (e.g., the conventional backdrilled via 220 shown in FIG. 2) likewise terminates (nominally, at least) substantially at an internal conductive trace (e.g., the intermediate conductive trace 206 shown in FIG. 2), but terminates in a tooled edge. Thus, a stub-less via fabricated in accordance with the preferred embodiments of the present invention is easily detected because a cross-section of the via structure would reveal a non-tooled edge. A cross-section of a conventional backdrilled via, on the other hand, would reveal a tooled edge that inherently results from the backdrilling process, i.e., the drill bit used in the backdrilling process inherently produces a via edge that is tapered and typically shows signs of metal movement, such as galling. Use of the present invention may be confirmed by chemical analysis of a cross-section of the insulator layers containing the via structure to detect the presence of a spinel-based electrically non-conductive metal oxide in the electrically non-conductive matrix material (i.e., the spinel-based electrically non-conductive metal oxide remains in via-bearing insulator layers in areas outside the via formation locations).

Figure 5:
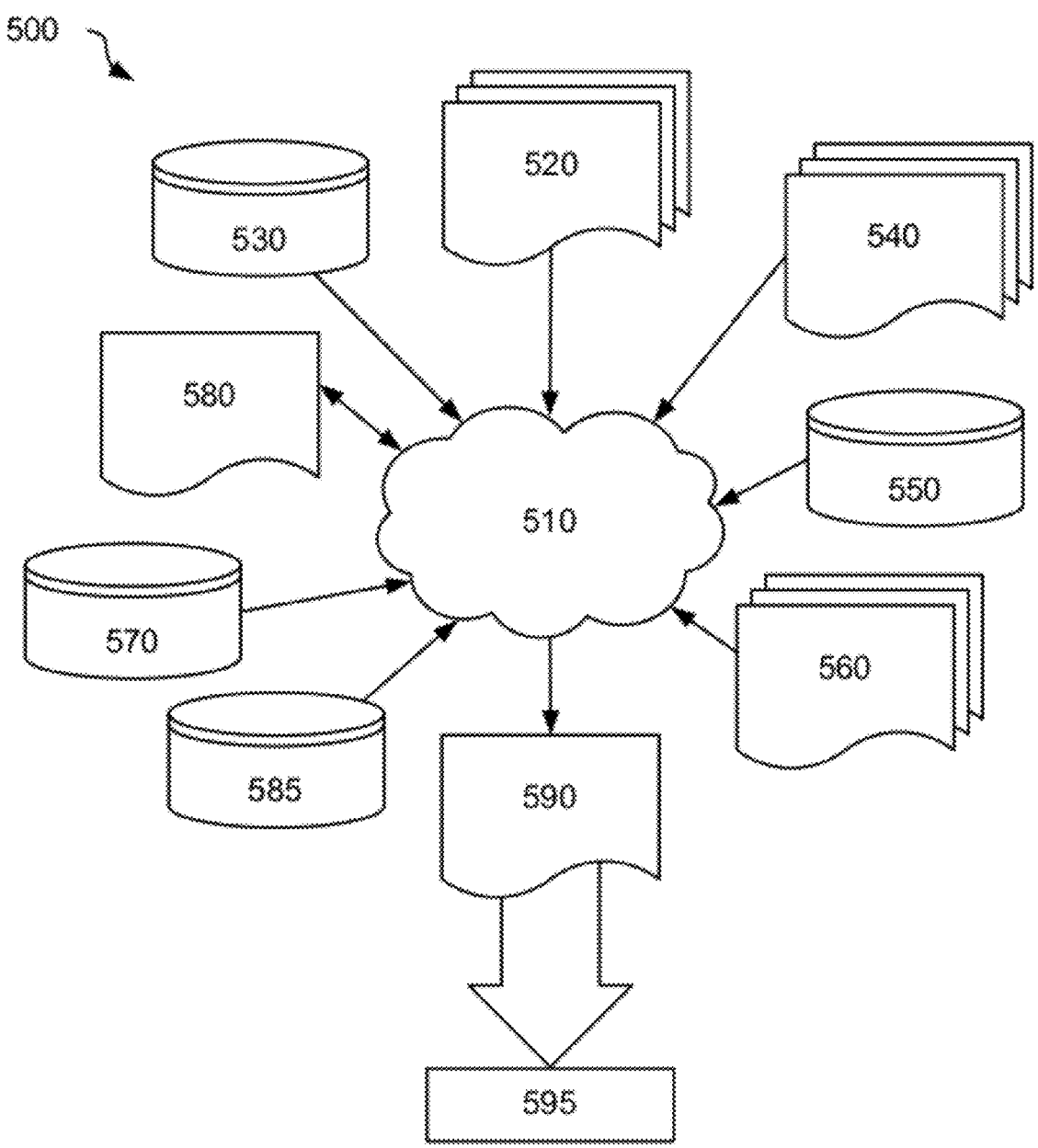
FIG. 5 is a flow diagram illustrating a design process used in printed wiring board (PWB), laminate subcomposite, interconnect substrate, or semiconductor IC logic design, manufacture, and/or test in accordance with the preferred embodiments of present invention.

FIG. 5 shows a block diagram of an exemplary design flow 500 used, for example, in printed wiring board (PWB), laminate subcomposite, interconnect substrate, or semiconductor IC logic design, simulation, test, layout, and manufacture.

Design flow 500 includes processes, machines and/or mechanisms for processing design structures or devices to generate logically or otherwise functionally equivalent representations of the design structures and/or devices described above and shown in FIGS. 4A-4G. The design structures processed and/or generated by design flow 500 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in a printed wiring board, laminate subcomposite, interconnect substrate, or IC design process, such as designing, manufacturing, or simulating a circuit, component, device, or system. For example, machines may include: layer-to-layer alignment control machines, lasers, lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 500 may vary depending on the type of representation being designed. For example, a design flow 500 for building an application specific IC (ASIC) may differ from a design flow 500 for designing a standard component or from a design flow 500 for instantiating the design into a programmable array, for example a programmable gate array (PGA) or a field programmable gate array (FPGA) offered by Altera® Inc. or Xilinx® Inc.

FIG. 5 illustrates multiple such design structures including an input design structure 520 that is preferably processed by a design process 510. Design structure 520 may be a logical simulation design structure generated and processed by design process 510 to produce a logically equivalent functional representation of a hardware device. Design structure 520 may also or alternatively comprise data and/or program instructions that when processed by design process 510, generate a functional representation of the physical structure of a hardware device. Whether representing functional and/or structural design features, design structure 520 may be generated using electronic computer-aided design (ECAD) such as implemented by a core developer/designer. When encoded on a machine-readable data transmission, gate array, or storage medium, design structure 520 may be accessed and processed by one or more hardware and/or software modules within design process 510 to simulate or otherwise functionally represent an electronic component, circuit, electronic or logic module, apparatus, device, or system such as those shown in FIGS. 4A-4G. As such, design structure 520 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 510 preferably employs and incorporates hardware and/or software modules for synthesizing, translating, or otherwise processing a design/simulation functional equivalent of the components, circuits, apparatus, devices, or logic structures shown in FIGS. 4A-4G to generate a netlist 580 which may contain design structures such as design structure 520. Netlist 580 may comprise, for example, compiled or otherwise processed data structures representing a list of wires, discrete components, logic gates, control circuits, I/O devices, models, etc. that describes the connections to other elements and circuits in a printed wiring board, laminate subcomposite, interconnect substrate, or integrated circuit design. Netlist 580 may be synthesized using an iterative process in which netlist 580 is resynthesized one or more times depending on design specifications and parameters for the device. As with other design structure types described herein, netlist 580 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 510 may include hardware and software modules for processing a variety of input data structure types including netlist 580. Such data structure types may reside, for example, within library elements 530 and include a set of commonly used elements, circuits, and devices, including models, layouts, and symbolic representations, for a given manufacturing technology (e.g., different technology nodes, 32 nm, 45 nm, 90 nm, and the like). The data structure types may further include design specifications 540, characterization data 550, verification data 560, design rules 570, and test data files 585 which may include input test patterns, output test results, and other testing information. Design process 510 may further include, for example, standard mechanical design processes such as stress analysis, thermal analysis, mechanical event simulation, process simulation for operations such as laminating, casting, molding, die press forming, and the like. One of ordinary skill in the art of mechanical design can appreciate the extent of possible mechanical design tools and applications used in design process 510 without deviating from the scope and spirit of the invention. Design process 510 may also include modules for performing standard circuit design processes such as timing analysis, verification, design rule checking, place and route operations, and the like.

Design process 510 employs and incorporates logic and physical design tools such as HDL compilers and simulation model build tools to process design structure 520 together with some or all of the depicted supporting data structures along with any additional mechanical design or data (if applicable), to generate a second design structure 590. Design structure 590 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 520, design structure 590 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 4A-4G. In one embodiment, design structure 590 may comprise a compiled, executable HDL simulation model that functionally simulates the devices shown in FIG. 4A-4G.

Design structure 590 may also employ a data format used for the exchange of layout data of integrated circuits and/or symbolic data format (e.g. information stored in a GDSII (GDS2), GL1, OASIS, map files, or any other suitable format for storing such design data structures). Design structure 590 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 4A-4G. Design structure 590 may then proceed to a stage 595 where, for example, design structure 590: proceeds to tape-out, is released to manufacturing, is released to a mask house, is sent to another design house, is sent back to the customer, and the like.

One skilled in the art will appreciate that many variations are possible within the scope of the present invention. For example, although the preferred embodiments of the present invention are described herein in the context of a printed wiring board (PWB), the present invention may be utilized in the context of other substrates, such as a laminate subcomposite, an interconnect substrate (e.g., an interposer or a module substrate) or a flex cable. In addition, although the preferred embodiments of the present invention are described herein in the context of forming a plurality of stub-less vias that have contact-pad-portions on a single side of a substrate, the present invention may be utilized in the context of forming a plurality of stub-less vias that contact-pad-portions on alternate sides of a substrate. Likewise, the present invention may be utilized in the context of forming PTH vias and/or buried vias. Thus, while the present invention has been particularly shown and described with reference to the preferred embodiments thereof, it will be understood by those skilled in the art that these and other changes in form and detail may be made therein without departing from the spirit and scope of the present invention.

What is claimed is:

1. A method comprising the steps of:
    providing one or more insulator layers of a first type, wherein each of the one or more insulator layers of the first type comprises a spinel-based electrically non-conductive metal oxide distributed in an electrically non-conductive matrix material;
    registering the one or more insulator layers of the first type with respect to a positional control mechanism or system;
    irradiating the one or more insulator layers of the first type with laser radiation at one or more via formation locations where a conductive via is to be formed, wherein for each of the one or more insulator layers of the first type the laser radiation is sufficient to break down the spinel-based electrically non-conductive metal oxide and release metal nuclei at the one or more via formation locations completely through the insulator layer from a first surface of the insulator layer to a second surface of the insulator layer;
    providing one or more insulator layers of a second type, wherein each of the one or more insulator layers of the second type comprises an electrically non-conductive material without a spinel-based electrically non-conductive metal oxide distributed therein;
    stacking, aligning and laminating the one or more insulator layers of the first type irradiated in the irradiating step and the one or more insulator layers of the second type to form a substrate;
    drilling one or more through-holes in the substrate at the one or more via formation locations, wherein each of the one or more through-holes extends completely through the substrate from a first surface of the substrate to a second surface of the substrate, and wherein metal nuclei released at the one or more via formation locations in the one or more insulator layers of the first type during the irradiating step are exposed in the through-hole;
    electroless metal plating on the metal nuclei exposed in each of the one or more through-holes to form electroless metal only along the metal nuclei on each of the one or more through-holes.

2. The method as recited in claim 1, further comprising the step of:
    electroplating on the electroless metal in each of the one or more through-holes to form a conductive via in each of the one or more through-holes.

3. The method as recited in claim 2, wherein a first one of the one or more insulator layers of the first type is positioned within the substrate immediately adjacent a first one of the one or more insulator layers of the second type, the method further comprising the step of:
    interposing a first conductive trace between the first one of the one or more insulator layers of the first type and the first one of the one or more insulator layers of the second type, wherein at least one said conductive via extends from the substrate's first surface to and terminates in a non-tooled edge substantially at the first conductive trace.

4. The method as recited in claim 3, wherein a second one of the insulator layers of the first type is positioned within the substrate immediately adjacent the first one of the insulator layers of the first type, the method further comprising the step of:
    interposing a second conductive trace between the first and second ones of the insulator layers of the first type, wherein at least one said conductive via extends from the substrate's first surface to and terminates in a non-tooled edge substantially at the second conductive trace.

5. The method as recited in claim 1, wherein the spinel-based electrically non-conductive metal oxide contains copper.

6. The method as recited in claim 1, wherein the electrically non-conductive matrix material comprises an organic or inorganic dielectric material selected from a group of materials consisting of FR-4, epoxy resins, ceramics, polyphenylene oxide (PPO)/triallylisocyanurate (TAIC) blends, perfluorinated or chlorinated materials, and combinations thereof.

7. A method comprising the steps of:
    providing one or more insulator layers of a first type, wherein each of the one or more insulator layers of the first type comprises a spinel-based electrically non-conductive metal oxide distributed in an electrically non-conductive matrix material;
    registering the one or more insulator layers of the first type with respect to a positional control mechanism or system;
    irradiating the one or more insulator layers of the first type with laser radiation at one or more via formation locations where a conductive via is to be formed, wherein for each of the one or more insulator layers of the first type the laser radiation is sufficient to break down the spinel-based electrically non-conductive metal oxide and release metal nuclei at the one or more via formation locations completely through the insulator layer from a first surface of the insulator layer to a second surface of the insulator layer;

providing one or more insulator layers of a second type, wherein each of the one or more insulator layers of the second type comprises an electrically non-conductive material without a spinel-based electrically non-conductive metal oxide distributed therein, and wherein a first one of the one or more insulator layers of the second type includes a conductive trace;

stacking, aligning and laminating the one or more insulator layers of the first type irradiated in the irradiating step and the one or more insulator layers of the second type to form a substrate, wherein a first one of the one or more insulator layers of the first type is positioned within the substrate immediately adjacent the first one of the one or more insulator layers of the second type such that the conductive trace is interposed between the first one of the one or more insulator layers of the first type and the first one of the one or more insulator layers of the second type;

drilling one or more through-holes in the substrate at the one or more via formation locations, wherein each of the one or more through-holes extends completely through the substrate from a first surface of the substrate to a second surface of the substrate, and wherein metal nuclei released at the one or more via formation locations in the one or more insulator layers of the first type during the irradiating step are exposed in the through-hole;

electroless metal plating on the metal nuclei exposed in each of the one or more through-holes to form electroless metal only along the metal nuclei on each of the one or more through-holes;

electroplating on the electroless metal in each of the one or more through-holes to form a conductive via in each of the one or more through-holes, wherein at least one said conductive via extends from the substrate's first surface to and terminates in a non-tooled edge substantially at the conductive trace.

8. A method comprising the steps of:

providing a plurality of insulator layers of a first type, wherein each of the insulator layers of the first type comprises a spinel-based electrically non-conductive metal oxide distributed in an electrically non-conductive matrix material, and wherein a first one of the insulator layers of the first type includes a first conductive trace;

registering the insulator layers of the first type with respect to a positional control mechanism or system;

irradiating the insulator layers of the first type with laser radiation at a plurality of via formation locations where a conductive via is to be formed, wherein for each of the insulator layers of the first type the laser radiation is sufficient to break down the spinel-based electrically non-conductive metal oxide and release metal nuclei at the via formation locations completely through the insulator layer from a first surface of the insulator layer to a second surface of the insulator layer;

providing one or more insulator layers of a second type, wherein each of the one or more insulator layers of the second type comprises an electrically non-conductive material without a spinel-based electrically non-conductive metal oxide distributed therein, and wherein a first one of the one or more insulator layers of the second type includes a second conductive trace;

stacking, aligning and laminating the insulator layers of the first type irradiated in the irradiating step and the one or more insulator layers of the second type to form a substrate, wherein the first one of the insulator layers of the first type is positioned within the substrate immediately adjacent the first one of the one or more insulator layers of the second type such that the second conductive trace is interposed between the first one of the insulator layers of the first type and the first one of the one or more insulator layers of the second type, and wherein a second one of the insulator layers of the first type is positioned within the substrate immediately adjacent the first one of the insulator layers of the first type such that the first conductive trace is interposed between the second one of the insulator layers of the first type and the first one of the insulator layers of the first type;

drilling a plurality of through-holes in the substrate at the via formation locations, wherein each of the through-holes extends completely through the substrate from a first surface of the substrate to a second surface of the substrate, and wherein metal nuclei released at the via formation locations in the insulator layers of the first type during the irradiating step are exposed in the through-hole;

electroless metal plating on the metal nuclei exposed in each of the through-holes to form electroless metal only along the metal nuclei on each of the through-holes;

electroplating on the electroless metal in each of the through-holes to form a conductive via in each of the through-holes, wherein at least one said conductive via extends from the substrate's first surface to and terminates in a non-tooled edge substantially at the first conductive trace, and wherein at least one said conductive via extends from the substrate's first surface to and terminates in a non-tooled edge substantially at the second conductive trace.

* * * * *